United States Patent
Chen et al.

(10) Patent No.: US 7,190,067 B2
(45) Date of Patent: Mar. 13, 2007

(54) SEMICONDUCTOR PACKAGE WITH EXPOSED HEAT SINK AND THE HEAT SINK THEREOF

(75) Inventors: Yen-Chun Chen, Taichung Hsien (TW); Sun-Zen Lin, Taichung Hsien (TW); Chich-Yuan Chang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/029,529

(22) Filed: Jan. 4, 2005

(65) Prior Publication Data

US 2005/0285258 A1    Dec. 29, 2005

(30) Foreign Application Priority Data

Jun. 28, 2004    (TW) ................. 93118741 A

(51) Int. Cl.
  *H01L 23/10* (2006.01)
(52) U.S. Cl. ...................................... 257/706
(58) Field of Classification Search ........ 257/706–714, 257/675
  See application file for complete search history.

(56) References Cited

U.S. PATENT DOCUMENTS

| | | | |
|---|---|---|---|
| 6,249,433 B1 | 6/2001 | Huang et al. | |
| 6,552,428 B1 * | 4/2003 | Huang et al. | 257/706 |
| 2003/0128520 A1 * | 7/2003 | Yang | 361/704 |
| 2004/0113263 A1 * | 6/2004 | Wu | 257/706 |
| 2004/0164404 A1 * | 8/2004 | Huang | 257/706 |
| 2005/0073036 A1 * | 4/2005 | Appelt et al. | 257/678 |
| 2005/0104195 A1 * | 5/2005 | Yang | 257/706 |

* cited by examiner

*Primary Examiner*—Nathan W. Ha
(74) *Attorney, Agent, or Firm*—Peter F. Corless; Steven M. Jensen; Edwards Angell Palmer & Dodge, LLP

(57) ABSTRACT

A semiconductor package with an exposed heat sink and the heat sink thereof are proposed. A carrier having a first surface and a second surface is provided. At least one chip is mounted on the first surface of the carrier and electrically connected to the carrier. A heat sink includes a flat portion having an exposed surface, and a support portion extended peripherally from the flat portion and attached to the first surface of the carrier, wherein the flat portion, the support portion and the carrier form a space where the chip is received, and the flat portion is peripherally formed with a stepped structure having at least one flash preventing groove located at a position adjacent to the exposed surface so as to prevent resin flashes on the exposed surface of the heat sink during a molding process for forming an encapsulant that encapsulates the chip.

18 Claims, 6 Drawing Sheets

SEMICONDUCTOR PACKAGE WITH EXPOSED HEAT SINK AND THE HEAT SINK THEREOF

FIELD OF THE INVENTION

The present invention relates to semiconductor packages with exposed heat sinks and the heat sinks thereof, and more particularly, to a ball grid array (BGA) semiconductor package having an exposed heat sink for preventing resin flashes, and the heat sink of the semiconductor package.

BACKGROUND OF THE INVENTION

The advancement of the semiconductor technology has raised the requirements of processing speed and functionality for chips, which induces a concern of how to effectively dissipate heat produced during operation of the chips so as to assure the reliability of semiconductor devices where the chips are incorporated. For example, a ball grid array (BGA) semiconductor package is usually used with devices having a large number of input/output (I/O) connections for highly integrated chips, such as 2D or 3D graphic chip, chip set, central processing unit (CPU), and memory, etc. If the heat dissipation problem cannot be properly solved, the performances of these devices would be adversely affected. Therefore, a solution to the heat dissipation problem has been proposed by mounting a heat sink in a semiconductor package.

In the conventional BGA semiconductor package, a typical heat dissipating path is to transmit heat from the chip through a silver paste, a substrate and thermal balls under the substrate, or through an encapsulant that encapsulates the chip, to outside of the semiconductor package. This heat dissipating path is relatively lengthy and does not provide a sufficient heat dissipating efficiency. In order to solve the heat dissipation problem, generally an exposed heat sink made of copper or aluminum is mounted on the BGA semiconductor package. As shown in FIG. 1, the semiconductor package with the exposed heat sink comprises: a substrate 11; a chip 12 attached to the substrate 11; a heat sink 13 mounted on the substrate 11; and an encapsulant 14 for encapsulating a portion of the substrate 11, the chip 12 and the heat sink 13, wherein the heat sink 13 comprises a bent support portion 131 for supporting the entire heat sink 13 and forming a space where the chip 12 is received. By this arrangement, heat produced by the chip 12 can be directly dissipated to the atmosphere via an exposed surface 130 of the heat sink 13 that has good thermal conductivity. Alternatively, a heat pipe or fan (not shown) can be externally mounted on the exposed surface 130 of the heat sink 13, such that the heat from the chip 12 can be more effectively dissipated out of the semiconductor package via the heat sink 13 and the heat pipe or fan, and the heat dissipating efficiency of the semiconductor package can be further improved.

The foregoing semiconductor package can desirably improve the heat dissipating efficiency thereof, however, it still has a drawback during a molding process of forming the encapsulant 14 in order to expose the surface 130 of the heat sink 13. As shown in FIG. 2, during the molding process, the surface 130 of the heat sink 13 to be exposed abuts against an inner surface 150 of an upper mold 15 of an encapsulating mold, such that the encapsulant 14 injected into a mold cavity of the upper mold 15 would not cover the surface 130 of the heat sink 13, and the surface 130 of the heat sink 13 can be exposed when the encapsulant 14 is cured. However, the surface 130 of the heat sink 13 may not be perfectly planar due to undesirable rolled portions being possibly formed at edges of the heat sink 13 fabricated by a stamping technique. This makes the surface 130 of the heat sink 13 not able to tightly abut against the inner surface 150 of the upper mold 15 during molding; further as the support portion 131 of the heat sink 13 is not effective to reduce a flowing speed of the encapsulant 14 and control the movement of the encapsulant 14, the encapsulant 14 may flash to gaps between the surface 130 of the heat sink 13 and the inner surface 150 of the upper mold 15, thereby causing flashes f of the encapsulant 14 on the exposed surface 130 of the heat sink 13 as shown in FIG. 3. This not only impairs the appearance of the packaged product but also reduces the heat dissipating area and the heat dissipating efficiency. If an additional deflash process is performed to remove the flashes f, the packaging cost would be increased and the fabricating processes would become complicated.

In light of the above flash problem, another heat sink structure has been proposed so as to reduce flashes of an encapsulant during molding. U.S. Pat. No. 6,249,433 has disclosed an exposed drop-in heat sink plastic ball grid array (EDHS-PBGA) semiconductor package for reducing flashes and improving the heat dissipating efficiency. As shown in FIG. 4A, this semiconductor package comprises a substrate 30; a chip 31 attached to the substrate 30 via an adhesive layer 34; a heat sink 32 mounted on the substrate 30; and an encapsulant 33 for encapsulating a portion of the substrate 30, the chip 31 and the heat sink 32. The heat sink 32 comprises a flat portion 325 having an exposed surface 321 and an inner surface 322, and a support portion 326 extended peripherally from the flat portion 325 and mounted on the substrate 30. The inner surface 322 of the flat portion 325 is spaced from bonding wires 36 and an active surface 310 of the chip 31 respectively by a predetermined distance. The exposed surface 321 of the flat portion 325 of the heat sink 32 is exposed from the encapsulant 33, such that heat produced by the chip 31 can be dissipated out of the semiconductor package via the exposed surface 321.

Further as shown in FIG. 4A, the exposed surface 321 of the flat portion 325 of the heat sink 32 is formed with a stepped structure 323 for preventing flashes. The stepped structure 323 comprises a first step surface 323a, a second step surface 323b, and a third step surface 323c, which have successively decreased elevations. During the molding process, when the encapsulant 33 is injected from an injection gate (not shown) and flows along the support portion 326 gradually to the third step surface 323c, due to a relatively smaller flow-accommodating space on the third step surface 323c, the encapsulant 33 would absorb heat from an encapsulating mold (not shown) and become more viscous to reduce its flowing speed. Then, when the encapsulant 33 enters the second step surface 323b, the flowing speed of the encapsulant 33 would be more reduced due to the even smaller flow-accommodating space on the second step surface 323b that is located in higher elevation than the third step surface 323c. Similarly, when the encapsulant 33 subsequently enters the topmost first step surface 323a where the flow-accommodating space becomes further smaller, the viscosity of the encapsulant 33 would be further increased to even reduce its flowing speed, thereby preventing the encapsulant 33 from flashing to the exposed surface 321 of the heat sink 32.

The above arrangement merely uses the gradually decreased flow-accommodating space caused by the specific stepped structure 323 of the heat sink 32 to reduce the flowing speed of the encapsulant 33. However, as the encapsulant 33 is made of resin and fillers, the stepped structure 323 can only prevent the relatively larger fillers from flashing to the exposed surface 321 of the heat sink 32 but is not effective to block the flow of resin that has high fluidity. Thus, the stepped structure 323 still fails to precisely control the movement of the encapsulant 33 and does not provide a satisfactory effect on blocking the flow of the encapsulant 33. As shown in FIGS. 4A and 4B, the transparent resin flashes f are formed on peripheral areas of the exposed surface 321 of the heat sink 32 as a result, and the resin flash problem is not properly solved. This similarly impairs the appearance of the packaged product and affects the heat dissipating efficiency. Moreover, if an additional deflash process is performed to remove the resin flashes f, the packaging cost would be increased and the fabricating processes would become complicated.

Therefore, the problem to be solved here is to provide a semiconductor package with an exposed heat sink, which can improve the heat dissipating efficiency and avoid the foregoing problems in the prior art.

SUMMARY OF THE INVENTION

In light of the above drawbacks in the prior art, an objective of the present invention is to provide a semiconductor package with an exposed heat sink and the heat sink thereof, which can prevent resin flashes and assure the appearance of an IC (integrated circuit) product.

Another objective of the present invention is to provide a semiconductor package with an exposed heat sink and the heat sink thereof, which can effectively improve the heat dissipating efficiency.

Still another objective of the present invention is to provide a semiconductor package with an exposed heat sink and the heat sink thereof, wherein the heat sink is structurally simple and is cost-effective to fabricate.

In order to achieve the foregoing and other objectives, the present invention proposes a semiconductor package with an exposed heat sink, comprising: a carrier having a first surface and a second surface; at least one chip mounted on the first surface of the carrier and electrically connected to the carrier; a heat sink comprising a flat portion having an exposed surface, and a support portion extended peripherally from the flat portion and attached to the first surface of the carrier, wherein the flat portion, the support portion and the substrate form a space where the chip is received, and the flat portion is peripherally formed with a stepped structure having at least one flash preventing groove located at a position adjacent to the exposed surface; and an encapsulant for encapsulating the chip, heat sink and a portion of the carrier, allowing the exposed surface of the heat sink to be exposed from the encapsulant.

The foregoing heat sink comprises a flat portion having an exposed surface; a support portion extended peripherally from the flat portion to form a space together with the flat portion; and a stepped structure formed peripherally on the flat portion and having at least one flash preventing groove located at a position adjacent to the exposed surface.

The flash preventing groove is formed peripherally around the exposed surface of the flat portion by a conventional stamping technique using a stamping cutting tool. The flash preventing groove has a recessed cavity and defines a side wall on the highest step surface of the stepped structure, and the height of the side wall is slightly lower than or equal to that of the exposed surface of the flat portion. Generally, the height of the side wall is slightly lower than that of the exposed surface of the flat portion by about 0.005 mm to 0.015 mm, preferably 0.01 mm; and the width of the side wall is of from 0.05 mm to 0.25 mm, preferably 0.1 mm.

During a molding process, when the encapsulant flows to the stepped structure, a flowing speed of the encapsulant is reduced due to a gradually decreased flow-accommodating space on the stepped structure, and the flow of encapsulant is further blocked by the side wall on the highest step surface of the stepped structure, such that any flash of the encapsulant over the side wall would be trapped in the flash preventing groove without reaching the relatively higher exposed surface of the heat sink. Unlike the prior art, the present invention completely prevents resin flashes on the exposed surface of the heat sink and thereby assures the heat dissipating efficiency of the semiconductor package.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with an exposed heat sink and the heat sink thereof proposed in the present invention are described in detail with reference to FIGS. 5A–5B, 6A–6B, 7, 8 and 9A–9B.

Figure 1:
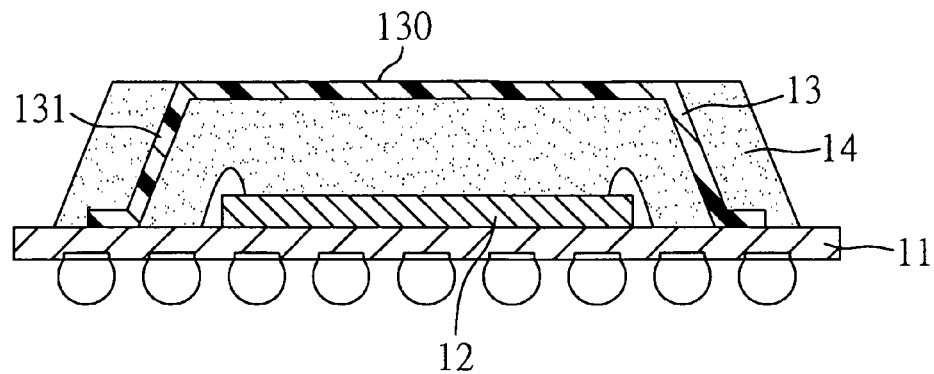
FIG. 1 (PRIOR ART) is a schematic cross-sectional view of a conventional BGA semiconductor package having an exposed heat sink.
Figure 2:
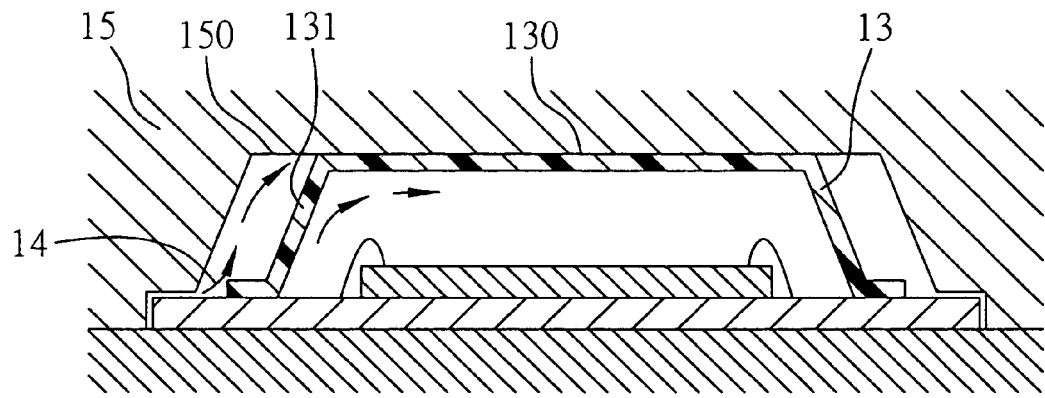
FIG. 2 (PRIOR ART) is a schematic diagram showing a molding process of the semiconductor package in FIG. 1.
Figure 3:
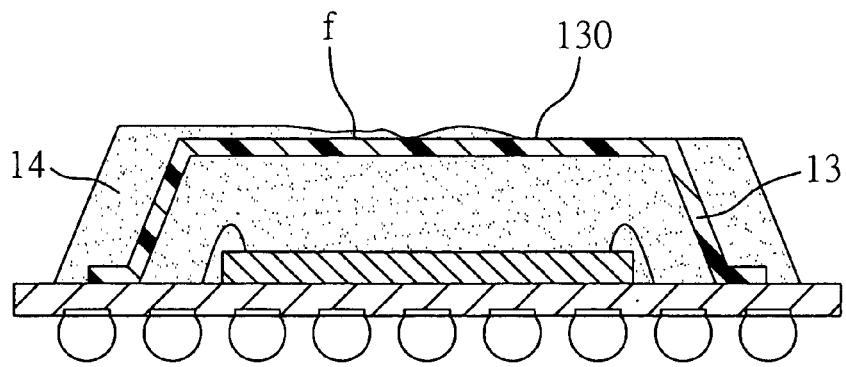
FIG. 3 (PRIOR ART) is a schematic diagram showing the occurrence of flashes in the semiconductor package in FIG. 1.
Figure 4A:
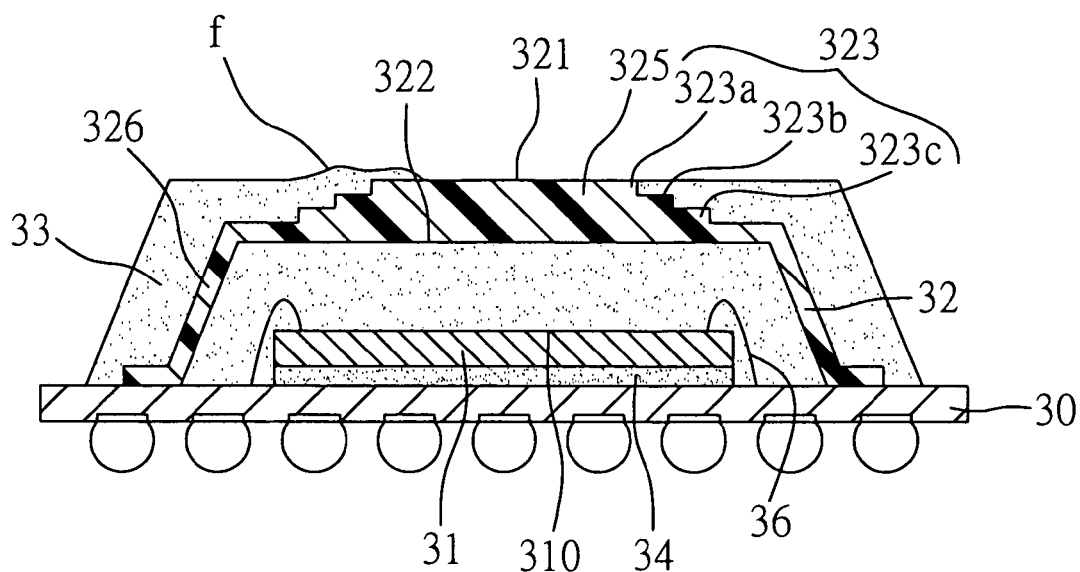
FIG. 4A (PRIOR ART) is a schematic cross-sectional view of a semiconductor package disclosed in U.S. Pat. No. 6,249,433.
Figure 4B:
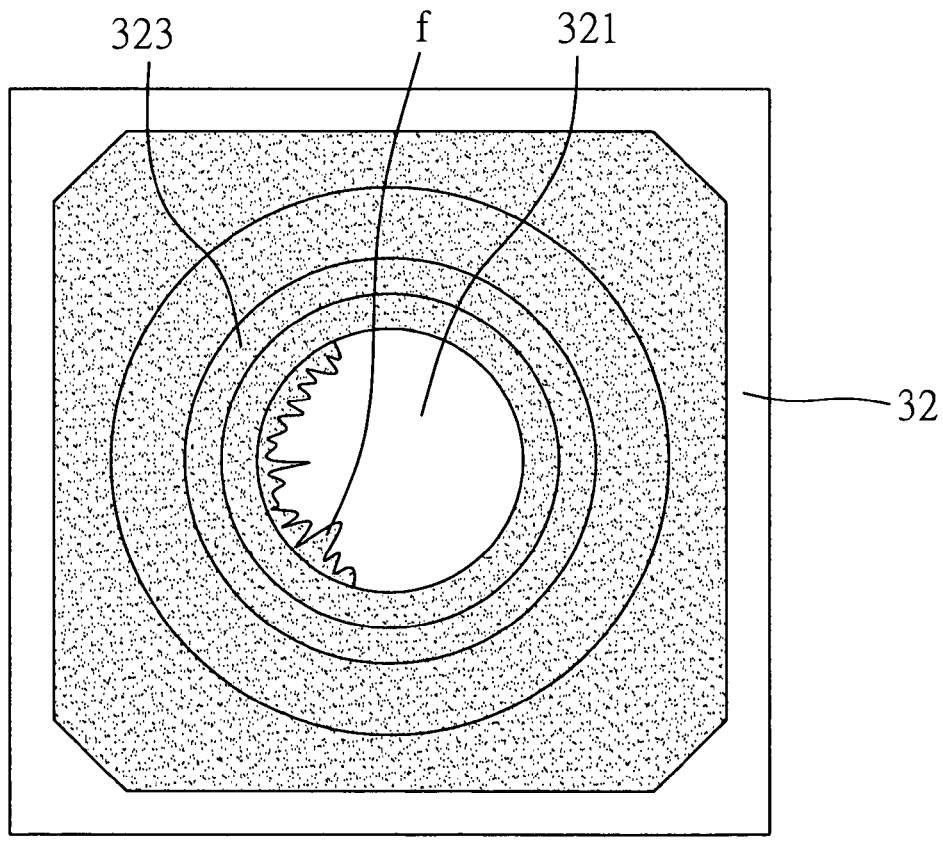
FIG. 4B (PRIOR ART) is a top view of a heat sink of the semiconductor package in FIG. 4A.
Figure 5A:
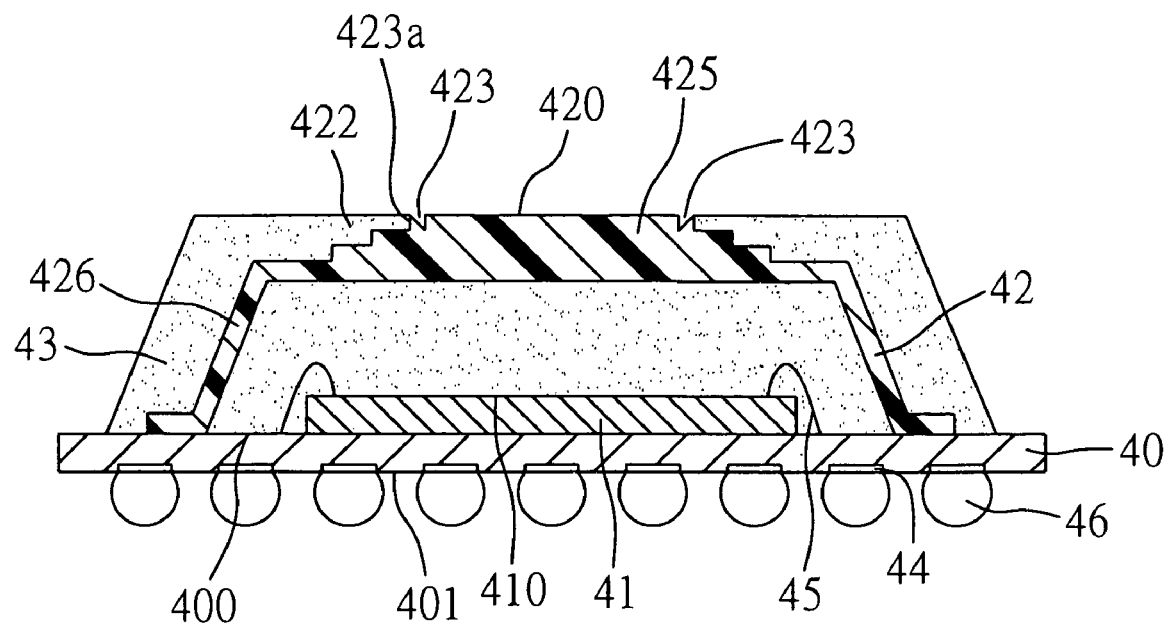
FIG. 5A is a schematic cross-sectional view of a semiconductor package in accordance with a preferred embodiment of the present invention.

As shown in FIG. 5A, the semiconductor package according to a preferred embodiment of the present invention comprises: a substrate 40; a chip 41 attached to the substrate 40 via an adhesive (not shown); and a heat sink 42 mounted on the substrate 40 and covering the chip 41. The substrate 40 has a first surface 400 and a second surface 401 opposed to the first surface 400, wherein a first conductive trace layer is formed on the first surface 400, and a second conductive trace layer is formed on the second surface 401, such that the first conductive trace layer is electrically connected to the second conductive trace layer by a plurality of conductive vias (not shown) formed through the substrate 40. A plurality of ball pads 44 are provided at terminals of conductive traces of the second conductive trace layer, and a plurality of solder balls 46 are bonded to the ball pads 44 to electrically connect the chip 41 to an external device. A plurality of bonding wires 45 are bonded to an active surface 410 of the chip 41 and electrically connect the chip 41 to the first conductive trace layer. The semiconductor package further comprises an encapsulant 43 formed on the first surface 400 of the substrate 40 by a molding process to encapsulate the chip 41, the heat sink 42, the bonding wires 45 and a portion of the substrate 40, wherein the heat sink 42 is partly exposed from the encapsulant 43.

Figure 5B:
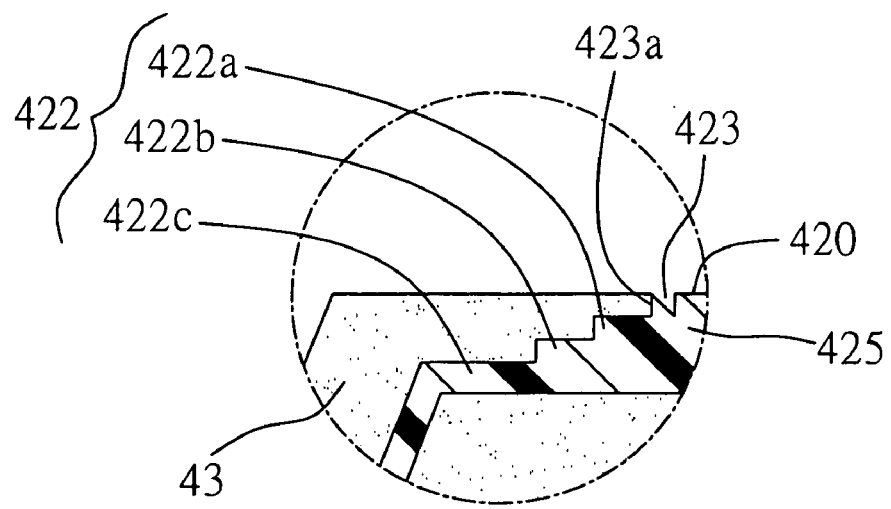
FIG. 5B is an enlarged view of a stepped structure and a flash preventing groove of the semiconductor package in FIG. 5A.
Figure 6A:
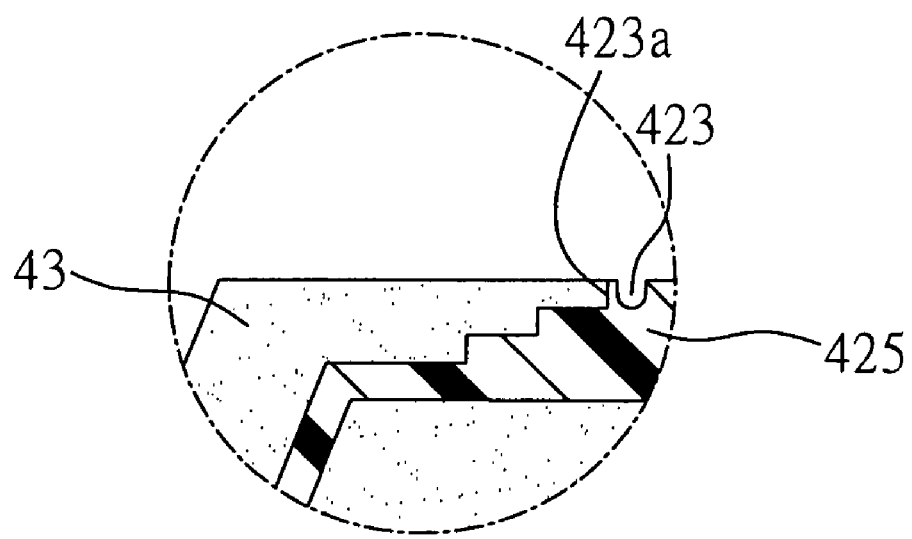
FIGS. 6A and 6B are schematic cross-sectional views of the stepped structure with the flash preventing groove in accordance with other preferred embodiments of the present invention.
Figure 6B:
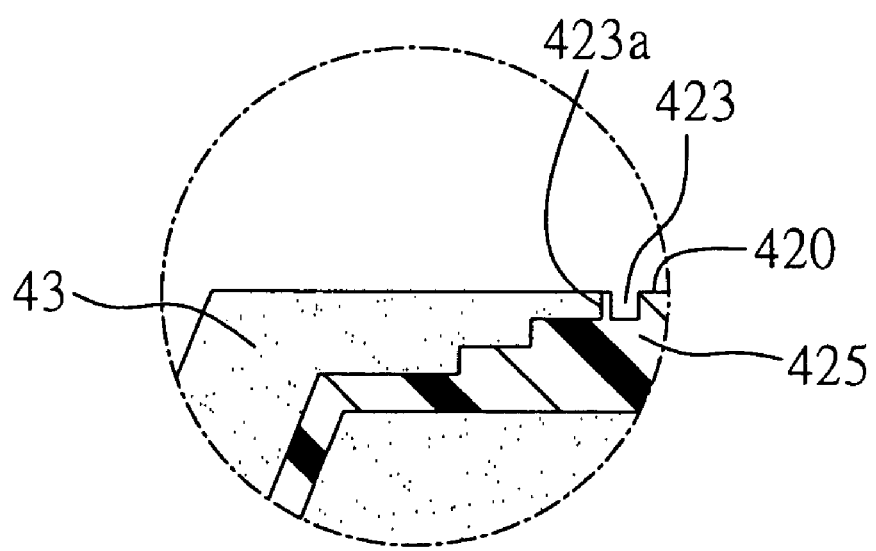

The heat sink 42 is made of a material having good thermal conductivity such as copper or aluminum. The heat sink 42 comprises a flat portion 425 having an exposed surface 420, and a bent support portion 426 extended peripherally from the flat portion 425. The heat sink 42 is supported on and attached to the first surface 400 of the substrata 40 via the support portion 426 thereof, and the flat portion 425, the support portion 426 and the first surface 400 of the substrate 40 form a space where the chip 41 and the bonding wires 45 are received. The flat portion 425 and the support portion 426 can be integrally formed. As shown in FIGS. 5A and 5B, the flat portion 425 is peripherally formed with a stepped structure 422, wherein the stepped structure 422 has at least one flash preventing groove 423 formed at a position adjacent to the exposed surface 420 of the flat portion 425. The flash preventing groove 423 is located peripherally around the exposed surface 420 of the flat portion 425.

In this embodiment, the stepped structure 422 is a 3-stepped structure comprising a first step surface 422a, a second step surface 422b and a third step surface 422c, which have successively decreased elevations. It should be understood that, the number of steps of the stepped structure 422 is not particularly limited in the present invention as long as the stepped structure 422 comprises at least one step. The flash preventing groove 423 has a side wall 423a located on the highest first step surface 422a of the stepped structure 422, wherein the height of the side wall 423a is slightly lower than or equal to that of the exposed surface 420 of the flat portion 425, which is exposed from the encapsulant 43.

In this embodiment, the height of the side wall 423a is slightly lower than that of the exposed surface 420 by about 0.005 mm to 0.015 mm, preferably 0.01 mm; and the width of the side wall 423a is of from 0.05 mm to 0.25 mm, preferably 0.1 mm. The flash preventing groove 423 is formed peripherally around the exposed surface 420 of the flat portion 425 by a conventional stamping technique using a stamping cutting tool to define the side wall 423a on the first step surface 422a.

A cross-sectional shape of the flash preventing groove 423 depends on the shape of the stamping cutting tool. In this embodiment, as shown in FIGS. 5A and 5B, the flash preventing groove 423 has a V shape and forms the side wall 423a for blocking the flow of encapsulant 43 during a molding process. Further, the flash preventing groove 423 can accommodate flashes of the encapsulant 43 over the side wall 423a, making the resin flashes trapped in the flash preventing groove 423. Alternatively, apart from the V shape, the flash preventing groove 423 may also be formed as a U shape shown in FIG. 6A or a rectangular shape shown in FIG. 6B. These shapes of the flash preventing groove 423 similarly achieve the desirable effects of blocking the flow of encapsulant 43 and trapping the resin flashes. It should be noted that the present invention is not limited to the shape and number of the flash preventing groove 423 and the shape and number of the side wall 423a defined by the flash preventing groove 423 as described in this embodiment, with the only requirement that the flash preventing groove 423 is formed peripherally around the exposed surface 420 or at a top edge of the stepped structure 422.

Figure 7:
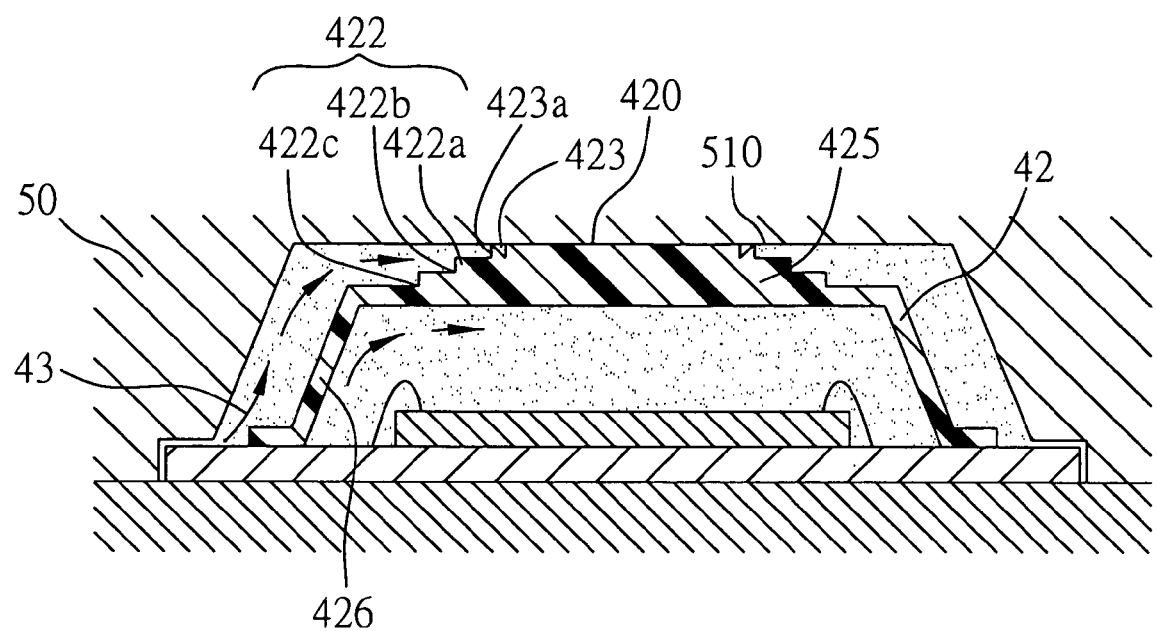
FIG. 7 is a schematic diagram showing a molding process of the semiconductor package in accordance with the present invention.
Figure 8:
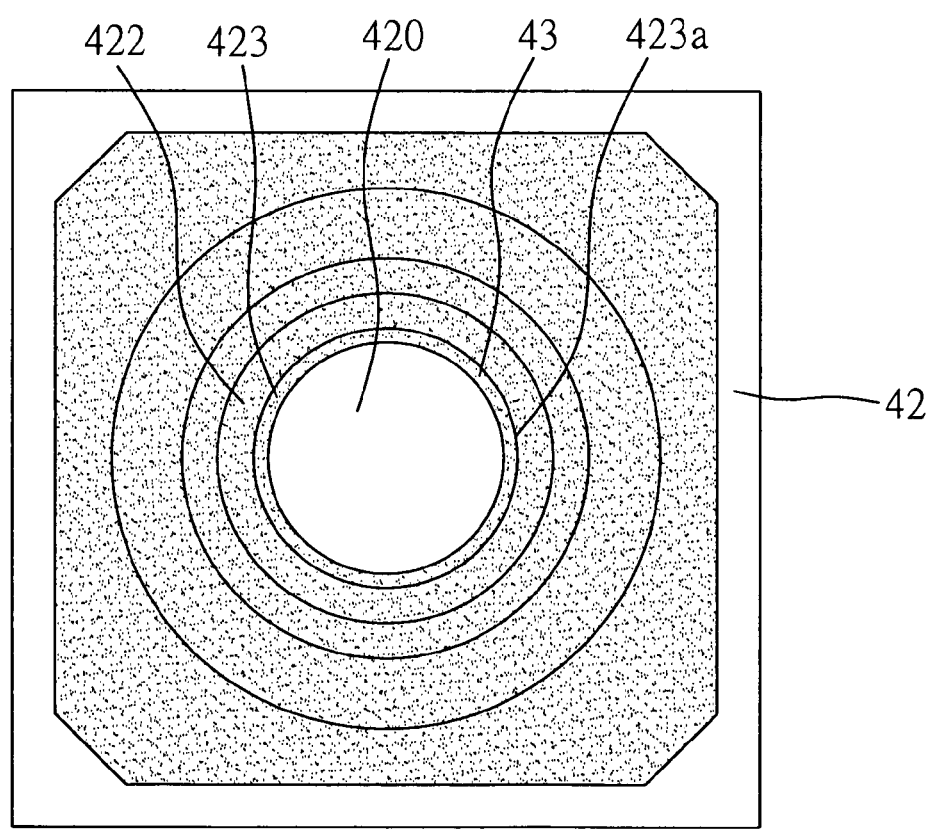
FIG. 8 is a top view of a heat sink of the semiconductor package after molding in accordance with the present invention.

By the provision of the flash preventing groove 423 and the stepped structure 422 in the present invention, during the molding process, as shown in FIG. 7, the exposed surface 420 of the flat portion 425 tightly abuts against an inner surface 500 of an upper mold 50, and the encapsulant 43 is injected from an injection gate (not shown) into a mold cavity of the upper mold 50. When the encapsulant 43 flows along the support portion 426 of the heat sink 42 to the lowest third step surface 422c of the stepped structure 422, the encapsulant 43 absorbs heat from the upper mold 50 and becomes more viscosity to reduce its flowing speed due to a relatively smaller flow-accommodating space on the third step surface 422c. Then, when the encapsulant 43 enters successively the second step surface 422b and the first step surface 422a, the flowing speed of the encapsulant 43 is further reduced due to the even smaller flow-accommodating spaces on the first and second step surfaces 422a, 422b. As a result, the encapsulant 43 fills a space encompassed by the first step surface 422a and the upper mold 50, and the flow of encapsulant 43 is blocked by the side wall 423a. Even if the flow of encapsulant 43 is not completely stopped by the side wall 423a and flashes over the side wall 423a (e.g. the resin part of the encapsulant 43), the resin flashes would be received and trapped in the flash preventing groove 423 without reaching the exposed surface 420 of the heat sink 42. As shown in FIG. 8 (a top view of the heat sink 42), the circular flash preventing groove 423 provides a recessed cavity for receiving and trapping any resin flash and assures no resin flash formed on the exposed surface 420, such that the problem in the prior art of failure to provide an effective resin stopping mechanism can be solved.

Unlike the prior art, the present invention provides an effective flash preventing mechanism to firmly stop the flow of encapsulant 43 after its flowing speed is reduced, such that the exposed surface 420 of the heat sink 42 is completely free of resin flashes. This not only solves the resin flash problem on the exposed surface of the heat sink, but also effectively maintains the heat dissipating area of the heat sink and the heat dissipating efficiency. Compared to the prior art, the present invention does not require any post-treatment to remove resin flashes from the heat sink, and thus the fabrication processes are simplified and the fabrication cost is decreased.

Figure 9A:
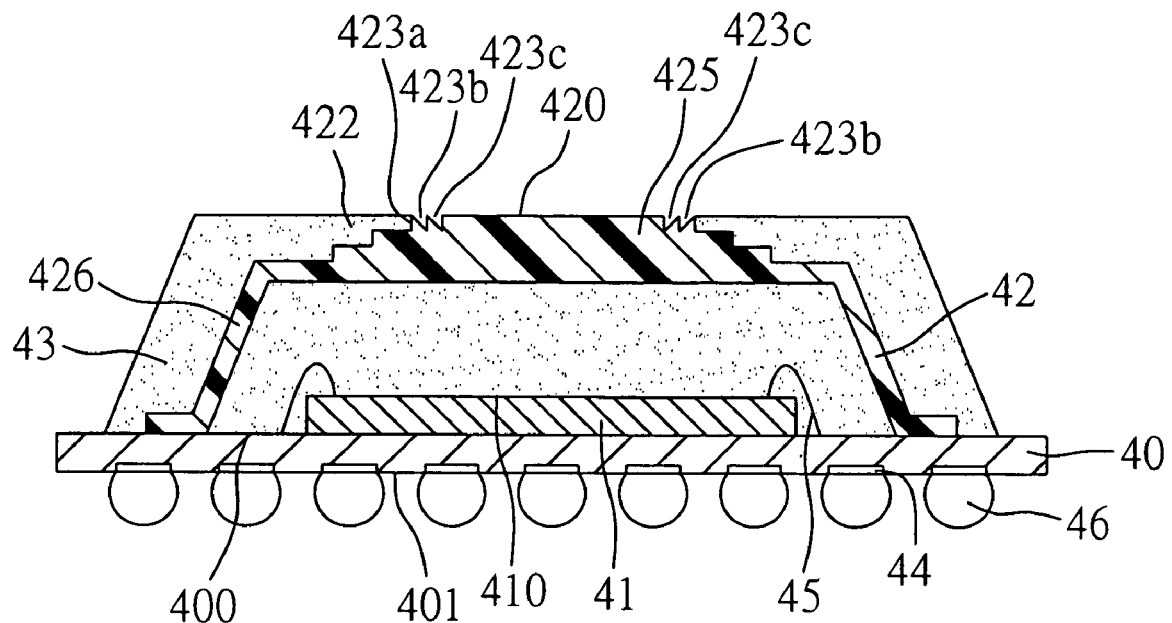
FIG. 9A is a schematic cross-sectional view of a semiconductor package in accordance with another preferred embodiment of the present invention.
Figure 9B:
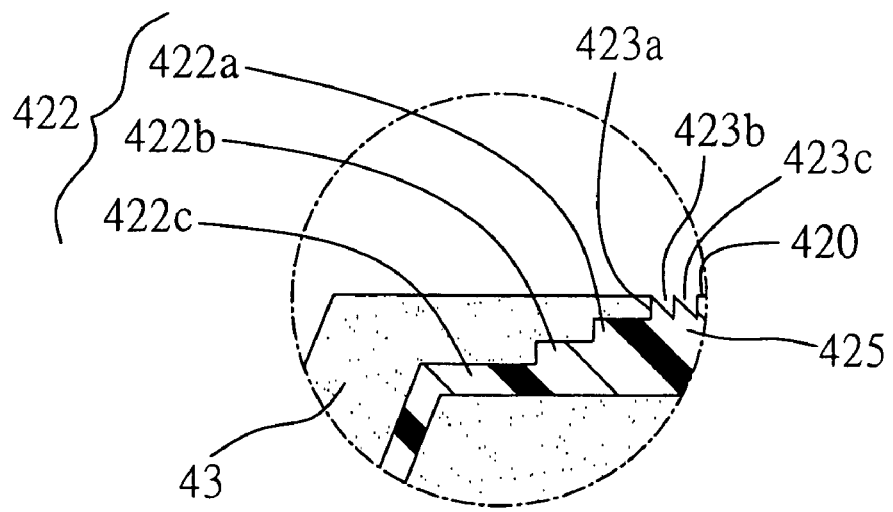
FIG. 9B is an enlarged view of a stepped structure and a flash preventing groove of the semiconductor package in FIG. 9A.

In the foregoing embodiment, the circular flash preventing groove 423 is formed peripherally on the flat portion 425 of the heat sink 42. It should be understood that the number of the flash preventing groove 423 is not particularly limited in the present invention. Generally, the more the flash preventing grooves 423 being provided, the better the resin trapping or stopping effect can be achieved. In another preferred embodiment, as shown in FIGS. 9A and 9B, two flash preventing grooves 423b, 423c are formed peripherally on the flat portion 425. In case the outer flash preventing groove 423b is not sufficient to stop the flow of encapsulant 43, the inner flash preventing groove 423c can accommodate and trap any resin flash and thus further enhances the flash preventing effect in the present invention.

In addition, the foregoing embodiments use the substrate as a chip carrier and electrically connect the chip to the substrate via the bonding wires. This arrangement does not set a limitation to the present invention. It should be understood that the relatively more important aspect of the present invention is on the flash preventing effect provided by the heat sink, rather than the use of the substrate and the electrical connection manner between the chip and the substrate. The present invention can also be applied to other package structures. For example, the substrate can be replaced by a lead frame, with the chip being mounted on a die pad of the lead frame; or alternatively, a flip-chip technique can be adopted to electrically connect the chip to the substrate. These modifications are all included in the present invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with an exposed heat sink, comprising:
    a carrier having a first surface and a second surface;
    at least one chip mounted on the first surface of the carrier and electrically connected to the carrier;
    a heat sink comprising a flat portion having an exposed surface, and a support portion extended peripherally from the flat portion and attached to the first surface of the carrier, wherein the flat portion, the support portion and the carrier form a space where the chip is received, and the flat portion is peripherally formed with a stepped structure having a plurality of steps and at least one flash preventing groove located at a position adjacent to the exposed surface, wherein the flash preventing groove has a side wall, and the height of an edge of the side wall is lower than that of the exposed surface of the heat sink; and
    an encapsulant for encapsulating the chip, the heat sink, and a portion of the carrier, with the exposed surface of the flat portion being exposed from the encapsulant, wherein a portion of the encapsulant is formed on the steps, the steps having successively decreased elevations.

2. The semiconductor package of claim 1, wherein the flash preventing groove is formed on the highest step of die stepped structure.

3. The semiconductor package of claim 1, wherein the flash preventing groove is located peripherally around the exposed surface.

4. The semiconductor package of claim 1, wherein the height of on the edge of the side wall is lower than that of the exposed surface of the heat sink by 0.005 mm to 0.015 mm.

5. The semiconductor package of claim 4, wherein the height of on the edge of the side wall is lower than that of the exposed surface of the heat sink by 0.01 mm.

6. The semiconductor package of claim 1, wherein the width of the side wall is of from 0.05 mm to 0.25 mm.

7. The semiconductor package of claim 6, wherein the width of the side wall is 0.1 mm.

8. The semiconductor package of claim 1, wherein the flash preventing groove has a cross-sectional shape selected from die group consisting of V shape, U shape and rectangular shape.

9. The semiconductor package of claim 1, wherein the chip is electrically connected to the carrier via bonding wires or in a flip-chip manner.

10. The semiconductor package of claim 1, wherein the carrier is a substrate or lead frame.

11. A heat sink for a semiconductor package, comprising:
    a flat portion having an exposed surface that is exposed from the semiconductor package;
    a support portion extended peripherally from the flat portion to form a space together with the flat portion; and
    a stepped structure formed peripherally on the flat portion, and having a plurality of steps and at least one flash preventing groove located at a position adjacent to the exposed surface, wherein the flash preventing groove has a side wall, the height of an edge of the side wall is lower than that of the exposed surface of the heat sink, and a portion of an encapsulant is formed on the steps, the steps having successively decreased elevations.

12. The heat sink of claim 11, wherein the flash preventing groove is formed on the highest step of the stepped structure.

13. The heat sink of claim 11, wherein the flash preventing groove is located peripherally around the exposed surface.

14. The heat sink of claim 11, wherein the height of the edge of the side wall is lower than that of the exposed surface of the heat sink by 0.005 mm to 0.015 mm.

15. The heat sink of claim 14, wherein the height of the edge of the side wall is lower than that of the exposed surface of the heat sink by 0.01 mm.

16. The heat sink of claim 11, wherein the width of the side wall is of from 0.05 mm to 0.25 mm.

17. The heat sink of claim 16, wherein the width of the side wall is 0.1 mm.

18. The heat sink of claim 11, wherein the flash preventing groove has a cross-sectional shape selected from the group consisting of V shape, U shape and rectangular shape.

* * * * *